(12) United States Patent
Zhu

(10) Patent No.: US 9,832,900 B2
(45) Date of Patent: Nov. 28, 2017

(54) FASTENING DEVICE AND FASTENING METHOD

(75) Inventor: Yu Hao Zhu, Nanjing (CN)

(73) Assignee: Siemens Aktiengesellschaft, Munich (DE)

( * ) Notice: Subject to any disclaimer, the term of this patent is extended or adjusted under 35 U.S.C. 154(b) by 239 days.

(21) Appl. No.: 14/427,466

(22) PCT Filed: Sep. 14, 2012

(86) PCT No.: PCT/CN2012/081397
§ 371 (c)(1),
(2), (4) Date: Aug. 20, 2015

(87) PCT Pub. No.: WO2014/040269
PCT Pub. Date: Mar. 20, 2014

(65) Prior Publication Data
US 2015/0359126 A1 Dec. 10, 2015

(51) Int. Cl.
| H01B 7/00 | (2006.01) |
| E05C 19/06 | (2006.01) |
| H05K 5/00 | (2006.01) |
| H05K 7/00 | (2006.01) |
| H05K 7/14 | (2006.01) |

(Continued)

(52) U.S. Cl.
CPC ............ *H05K 7/1417* (2013.01); *F16B 2/12* (2013.01); *F16B 2/22* (2013.01); *H02B 1/044* (2013.01);

(Continued)

(58) Field of Classification Search
CPC ........ H02G 3/128; H02B 1/04; H02B 1/0523; H02B 1/32; H02B 1/42; E05C 19/063;

(Continued)

(56) References Cited

U.S. PATENT DOCUMENTS

| 2,153,077 A | * | 4/1939 | Clarke | ................ A44B 11/2519 |
| | | | | 24/634 |
| 4,527,821 A | * | 7/1985 | Tanaka | .................... E05C 19/06 |
| | | | | 24/297 |

(Continued)

FOREIGN PATENT DOCUMENTS

| CH | 662693 | 10/1987 |
| CN | 1032328 | 7/1996 |

(Continued)

OTHER PUBLICATIONS

Enclosed is a Search Report dated Jun. 20, 2013 issued in the corresponding International Patent Application No. PCT/CN2012/081397.

(Continued)

*Primary Examiner* — Chau N Nguyen
*Assistant Examiner* — Roshn Varghese
(74) *Attorney, Agent, or Firm* — Cozen O'Connor

(57) ABSTRACT

A fastening device and fastening method for fastening a distribution box control panel to a distribution box, the fastening device comprising a push block, a biasing member, a shell, and a locking member sleeved in the shell, wherein the method utilizes the biasing force of the biasing member to fasten the device, and utilizes the elasticity of the locking member having a bending structure to realize assembly and disassembly, where a user can conveniently assemble the device with hand alone, i.e., during assembly, the fastening device is pushed in along a notch in the distribution box control panel and then pressed tightly, and during disassembly, the fastening device can be pushed out after the locking member is pressed such that in comparison to a screw fastening method, the fastening device of the present invention provides a constant fastening force, thus realizing more stable and reliable fastening.

12 Claims, 6 Drawing Sheets

(51) Int. Cl.
*F16B 2/22* (2006.01)
*F16B 2/12* (2006.01)
*H02G 3/08* (2006.01)
*H02G 3/14* (2006.01)
*H02B 1/044* (2006.01)

(52) U.S. Cl.
CPC .................. *H02G 3/08* (2013.01); *H02G 3/14* (2013.01); *Y10T 24/4465* (2015.01); *Y10T 29/49947* (2015.01)

(58) Field of Classification Search
CPC ........ E05C 19/02; E05C 19/066; E05C 17/48; E05C 17/52; E05C 2007/007; H01R 13/62911; H01R 13/74; H01R 13/741; H01R 4/4836; H01R 9/03; F16B 2/12; F16B 2/14; F16B 2/22; F16B 2/243; F16B 2/245; F16B 2/246; F16B 37/045; F16B 37/046; H05K 7/12; Y10T 292/082; Y10T 292/0876; Y10T 292/0878; Y10T 292/088; Y10T 292/0894; Y10T 292/0902; Y10T 292/0907; Y10T 292/42; Y10T 292/432; Y10T 292/438; Y10T 24/44017
USPC .......... 439/715; 292/19, 70, 74, 80, 91, 170, 292/302, 303, 342; 248/229.12, 316.6, 248/346.04, 632, 655; 24/634, 708.3; 411/85, 104, 111, 522
See application file for complete search history.

(56) References Cited

U.S. PATENT DOCUMENTS

| | | | | |
|---|---|---|---|---|
| 4,616,861 A * | 10/1986 | Kurosaki | ............. | E05C 19/022 292/129 |
| 4,736,270 A * | 4/1988 | Porter | .................. | H05K 7/1417 174/138 D |
| 5,217,262 A * | 6/1993 | Kurosaki | ............... | E05C 19/022 292/6 |
| 5,754,406 A * | 5/1998 | Hardt | ...................... | G06F 1/184 361/732 |
| 5,886,868 A * | 3/1999 | White | .................... | H02B 1/066 361/652 |
| 6,021,049 A * | 2/2000 | Thompson | ........... | H05K 7/1409 361/679.27 |
| 2004/0069520 A1 | 4/2004 | Lopez et al. | | |
| 2012/0275127 A1 * | 11/2012 | Liu | ...................... | H05K 7/1418 361/759 |

FOREIGN PATENT DOCUMENTS

| | | |
|---|---|---|
| CN | 2558126 | 6/2003 |
| CN | 201113236 | 9/2008 |
| CN | 201699372 | 1/2011 |
| DE | 7535902 | 3/1976 |
| DE | 29508292 | 9/1996 |
| EP | 0 837 535 | 4/1998 |
| FR | 2666482 | 3/1992 |
| GB | 2167907 | 6/1986 |
| JP | 08-205326 | 8/1996 |
| JP | 10-191511 | 7/1998 |
| JP | 2008-289263 | 11/2008 |
| KR | 20100000164 | 1/2010 |

OTHER PUBLICATIONS

Office Action dated Jan. 18, 2016 which issued in the corresponding Chinese Patent Application No. 201280075780.5.
Search Report dated Mar. 23, 2016 which issued in the corresponding European Patent Application No. 12884352.1.

* cited by examiner

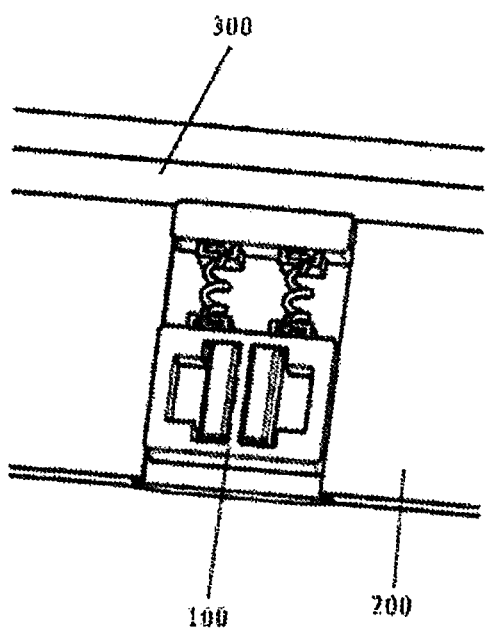
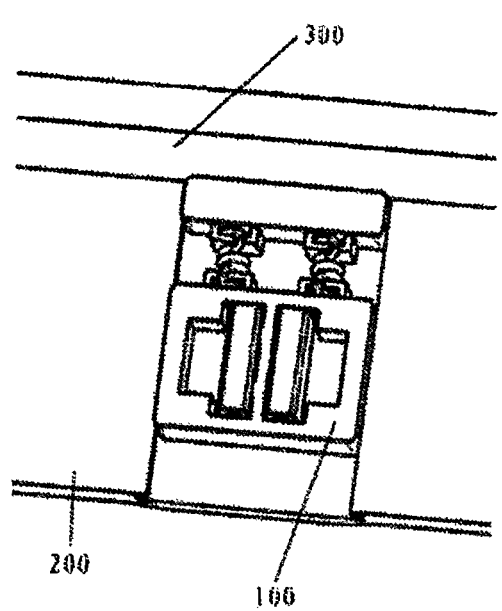
*Fig. 5A*  *Fig. 5B*

FASTENING DEVICE AND FASTENING METHOD

CROSS-REFERENCE TO RELATED APPLICATIONS

This is a U.S. national stage of application No. PCT/CN2012/081397 filed 14 Sep. 2012.

BACKGROUND OF THE INVENTION

1. Field of the Invention

The present invention relates to a fastening device and a fastening method and, more particularly, to a fastening device and a fastening method for fastening a distribution box control panel to a distribution box.

2. Description of the Related Art

Most control panels for distribution boxes, such as HMI and NC panels, namely human-machine interaction interfaces and numerical control units, require fastening screws for installation to the distribution boxes, and the fastening screws require a specific torque. In this case, when fixing the HMI and NC panel to the distribution box, a user needs to put an installation snap into a grating of the HMI and NC panel and then tighten the screw, ensuring that the product is completely fixed. In order to prevent screw slippage or snap release caused by an excessively high torque on the screw, the maximum torque of the screw will be limited in the product specification. However, if the user adopts a manual installation method, it is difficult to control the torque within the required range, which would easily lead to the tilting of the installation snap together with the screw, thereby affecting the installation and user experience. Moreover, screws are used to clamp the distribution box. As a result, an additional mounting tool (such as a screwdriver) is required.

To this end, how to make it possible for a distribution box control panel, such as an HMI and NC panel, to be quickly and easily installed and fixed on the distribution box becomes a problem to be solved urgently in the art.

SUMMARY OF THE INVENTION

In view of the foregoing, it is an object of the present invention to provide a fastening device and a distribution box control panel, where the distribution box control panel can be easily and quickly installed on and fixed to a distribution box via the fastening device. It is also an object of the present invention to provide a distribution box control panel assembly comprising the fastening device and the distribution box control panel described above, and a method for fastening a distribution box control panel to a distribution box using a fastening device.

These and other objects and advantages are achieved in accordance with the present invention, where the fastening device comprises a push block, a biasing member, a housing, and a locking member sheathed in the housing, the biasing member is positioned between the push block and the housing in a longitudinal direction and is deformable to provide a fastening force, the locking member is of a bent structure so as to have elasticity in a transverse direction, and where the locking member has tooth-like structures transversely protruding from two sides of the housing in opposite directions, such that when the locking member is pressed towards the center in the transverse direction, the tooth-like structures can retract into the housing.

Preferably, the fastening device is used for fastening a distribution box control panel to a distribution box. When the fastening device is installed in the distribution box control panel, the push block bears against the distribution box, and the tooth-like structures of the locking member engage with corresponding tooth-like structures arranged on two sides of a fastening device installation portion of the distribution box control panel.

Preferably, the distribution box control panel is an HMI or NC panel, i.e., a human-machine interaction interface or numerical control unit.

Preferably, the biasing member is a spring, and more preferably a coil spring, and the fastening force is a restoring force of the spring.

Preferably, the push block is removably or permanently connected to the biasing member, the housing is removably or permanently connected to the biasing member, and the housing is removably or permanently connected to the locking member.

Preferably, the housing has a hollow opening, through which the locking member is sheathed in the housing.

Preferably, the housing comprises a longitudinal beam formed in the center of the opening, the thickness of the longitudinal beam is less than the thickness of the housing, and at least one protrusion is formed on two sides of the longitudinal beam, respectively. In addition, the locking member has a groove formed in a central portion and penetrating through in the longitudinal direction, and at least one notch, the position and number of which correspond to those of the at least one protrusion of the longitudinal beam of the housing, is formed on two side walls of the groove, respectively.

Preferably, the locking member has a cross section substantially shaped like the Chinese character "凹" (or substantially U-Shaped) having an open bottom, and has extensions extending transversely and outwardly from two edges at the bottom, and the tooth-like structures of the locking member are provided at outer rims of the extensions.

Preferably, the tooth-like structures of the locking member are composed of continuous or intermittent teeth.

Preferably, the push block, the housing and the locking member are made of plastic.

In accordance with a further embodiment of the present invention, a distribution box control panel has a fastening device installation portion for the above-mentioned fastening device, the fastening device installation portion being configured as a cut-out formed in a side wall of the distribution box control panel, two sides of the fastening device installation portion being formed with a tooth-like structure, and the tooth-like structures being configured to be able to engage with the tooth-like structures of the locking member of the fastening device.

In accordance with a yet further embodiment of the present invention, a distribution box control panel assembly comprises a fastening device as described above and a distribution box control panel as described above.

In accordance with a still further aspect of the present invention, it is an object to provide a method for fastening a distribution box control panel to a distribution box using the above-mentioned fastening device, where the method comprises pushing the fastening device into the fastening device installation portion of the distribution box control panel while pressing the locking member, such that the push block bears against the distribution box, further pushing the fastening device towards the distribution box to cause the biasing member to become deformed, and loosening the locking member to engage the tooth-like structures of the locking member with the tooth-like structures on the distribution box control panel.

Preferably, the step of making the biasing member deformed causes the amount of deformation of the biasing member to reach a maximum.

It can be seen from the above-mentioned solution that in the presently disclosed embodiments of the invention, the biasing force of the biasing member (for example, the elastic force of a spring) is used to fasten equipment and the elasticity of the locking member having a bent structure is used to realize assembly and disassembly. Therefore, the user can conveniently assemble the device by hand alone, i.e., during assembly, the fastening device is pushed in along a cut-out on the distribution box control panel and then pressed tightly, and during disassembly, the fastening device can be pushed out by only pressing the locking member. Compared with a fastening method via screws, the fastening device of the present disclosed embodiments of the invention provides a constant fastening force and, thus, can realize more stable and reliable fastening.

In addition, in the fastening device of the present embodiments of the invention, there is no need for a snap to be hooked into the grating of the distribution box control panel, such as an HMI and NC panel. Instead, the engagement of the tooth-like structures of the locking member and the tooth-like structures on two sides of the cut-out of the distribution box control panel is used to achieve disassembly and assembly, and therefore the present embodiments of the invention can be used with iron plates of various thicknesses and disassembly and assembly are very convenient.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

Preferred embodiments of the present invention will be described below in detail with reference to the accompanying drawings, so that the above-mentioned and other features and advantages of the present invention will become more apparent to those skilled in the art, in which drawings:

FIGS. 5A and 5B are schematic views of the distribution box control panel when it is assembled onto a distribution box by means of the fastening device in accordance with the present invention.

DETAILED DESCRIPTION OF THE EXEMPLARY EMBODIMENTS

In order to make the object, technical solution and advantages of the present invention become more apparent, the present invention is described in further detail via the following embodiments.

Figure 1:
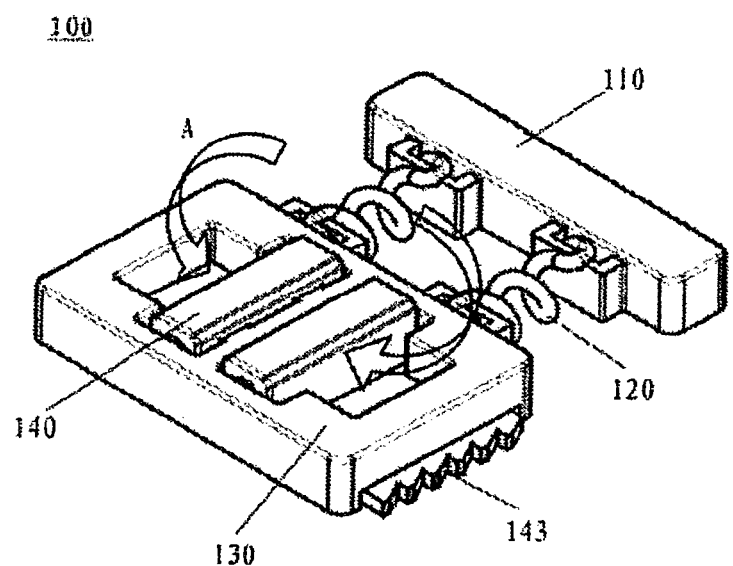
FIG. 1 is a perspective view of a fastening device in accordance with the present invention.
Figure 2:
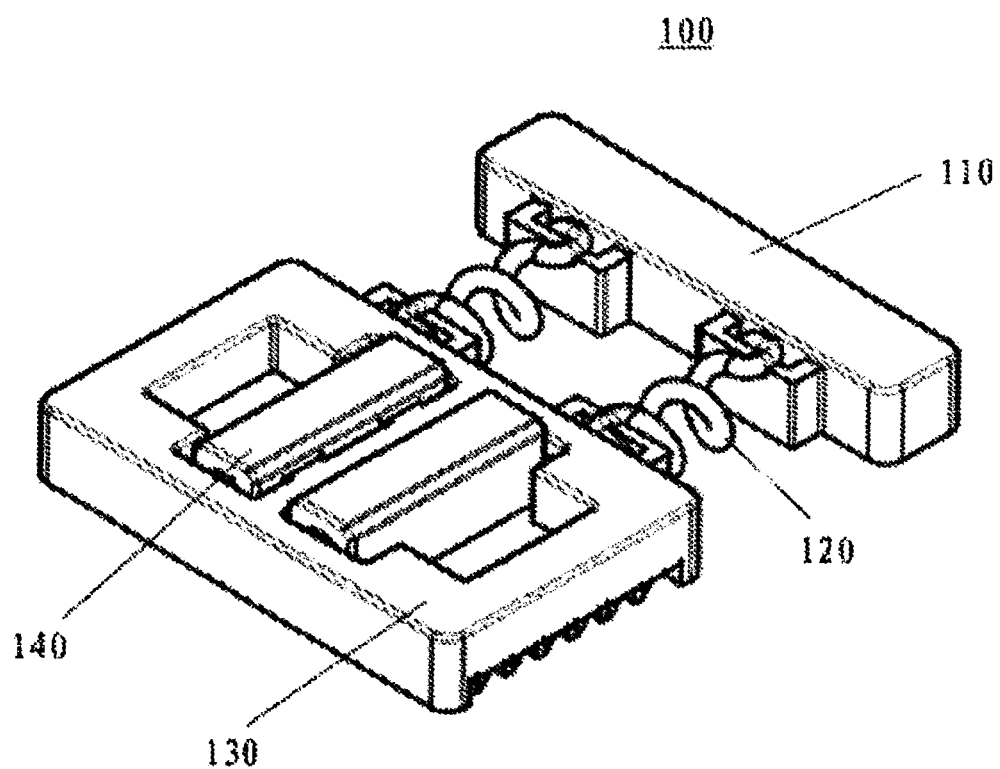
FIG. 2 is a state diagram of the fastening device in accordance with the invention when pressed in the directions indicated by the arrows A in FIG. 1.
Figure 3:
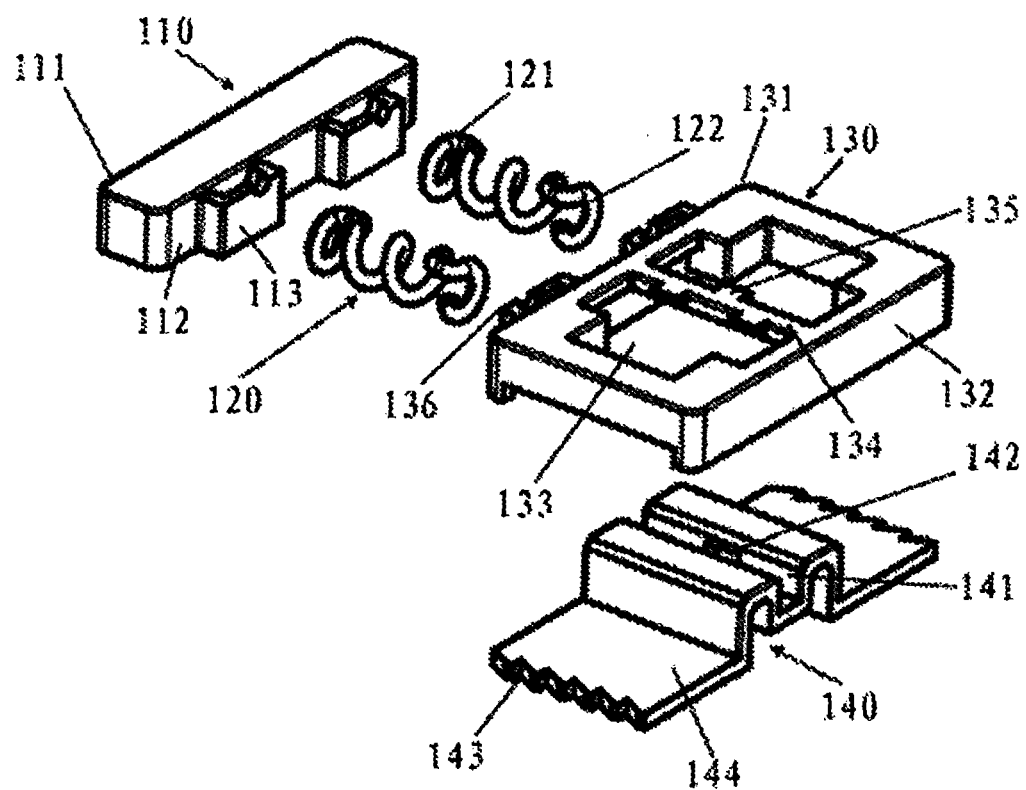
FIG. 3 is an exploded view of the fastening device in accordance with the present invention.

As shown in FIGS. 1-3, a fastening device 100 in accordance with the present invention comprises a push block 110, a biasing member 120, a housing 130, and a locking member 140 sheathed in the housing 130. The biasing member 120 is positioned between the push block 110 and the housing 130 in a longitudinal direction and is deformable to provide a fastening force. The locking member 140 has a bent structure so as to have elasticity in a transverse direction, and the locking member 140 has tooth-like structures 143 transversely protruding from two sides of the housing 130 in opposite directions. As indicated by the arrows A in FIG. 1, when the locking member 140 is pressed towards the center in the transverse direction, the tooth-like structures 143 can retract into the housing 130, as shown in FIG. 2.

The push block 110 can have a substantially rectangular parallelepiped shape which has a first side 111 and an opposite, second side 112 for bearing against a distribution box. The push block 110 is preferably made of plastic, for example, by injection molding, but may also be made of other suitable materials. As shown in the figures, one or more protrusions 113 may be formed on the second side 112 of the push block 110, for receiving the biasing member 120. Those skilled in the art would understand that the second side 112 of the push block 110 may have any configuration suitable for contact with the biasing member, without being limited to that shown herein, and the push block 110 may be removably or permanently connected to the biasing member 120.

The biasing member 120 may be a spring, preferably a coil spring, positioned between the push block 110 and the housing 130 in the longitudinal direction. The biasing member 120 may generate a restoring force by deformation, and the restoring force is used as a fastening force. The biasing member 120 has a first end 121 connected to the second side 112 of the push block 110 and a second end 122 opposite to the first end 121. Depending on the specific application, the number of biasing members 120 may be one or more.

The housing 130 may have a substantially rectangular parallelepiped shape, having a first side 131 connected to the biasing member 120 and a second side 132 opposite to the first side 131, and having a hollow opening 133. The opening 133 provides a space for the user to access the locking member 140 for operation, in addition to being used to receive the locking member 140. A longitudinal beam 134 extending from the first side 131 to the second side 132 of the housing 130 is formed at the center of the opening 133, and the thickness of the longitudinal beam 134 is less than that of the housing 130. At least one protrusion 135 is formed on two sides of the longitudinal beam 134, respectively, for snap-fitting and locking with the locking member 140. The housing 130 is preferably made of plastic, for example, by injection molding, but may also be made of other suitable materials. As shown in the figures, one or more protrusions 136 may be formed on the first side 131 of the housing 130 for receiving the biasing member 120. Those skilled in the art would understand that the first side 131 of the housing 130 may have any configuration suitable for contact with the biasing member, without being limited to that shown herein, and the housing 130 may be removably or permanently connected to the biasing member 120.

The locking member 140 is of a bent structure so as to have elasticity in the transverse direction. The locking member 140 has a groove 141 formed in a central portion and penetrating through in the longitudinal direction, and at least one notch 142, the position and number of which correspond to those of the protrusions 135 of the longitudinal beam 134 of the housing 130, is formed on two side walls of the groove 141, respectively. When the locking member 140 is mounted to the housing 130 from the bottom of the opening 133 of the housing 130, the protrusion 135 and the notch 142 are snap-fitted with each other such that the locking member 140 and the housing 130 are fixed together to each other. Although in the illustrated example the locking member 140 and the housing 130 are removably fixed via the snap-fitting of the protrusion 135 on the longitudinal beam 134 of the housing 130 with the notch 142 of the groove 141 of the locking member 140, those skilled in the art would understand that the locking member 140 and the housing 130 may be permanently fixed to each other, such as by adhesive bonding.

The locking member 140 has tooth-like structures 143, transversely protruding from two sides of the housing 130 in opposite directions, for engaging with the tooth-like structures on the distribution box control panel. Preferably, as shown in FIG. 3, the bent structure of the locking member 140 has a cross section substantially shaped like the Chinese character "凹" (or substantially U-Shaped) having an open bottom, and has extensions 144 extending transversely and outwardly from two edges at the bottom, and the tooth-like structures 143 of the locking member 140 are provided at outer rims of the extensions 144. The locking member 140 is preferably made of plastic, for example, by injection molding, but may also be made of other suitable materials. Although the tooth-like structures 143 of the locking member 140 are shown in the figures as composed of continuous teeth, those skilled in the art would understand that the tooth-like structures 143 may also be composed of intermittent teeth.

In an unstressed state of the locking member 140, as shown in FIG. 1, the tooth-like structures 143 of the locking member 140 extend or protrude out of the housing 130 in the transverse direction (in FIG. 1, only one tooth-like structure 143 is visible). When the locking member 140 is pressed from two sides in the direction indicated by the arrows A, as shown in FIG. 2, the tooth-like structure 143 of the locking member 140 can retract into the housing 130, i.e., retract inwardly to be flush with an edge of the housing 130 or retract into the edge of the housing 130 (in FIG. 2, only one tooth-like structure 143 is visible).

Figure 4:
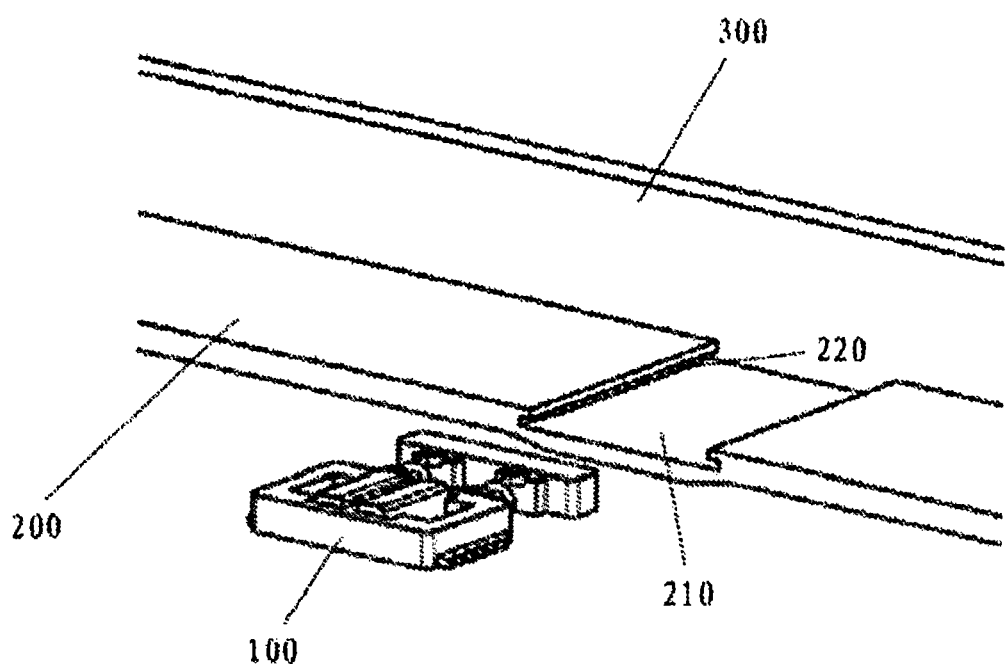
FIG. 4 is a schematic view of a distribution box control panel assembly in accordance with the present invention, particularly showing the structure of a distribution box control panel in accordance with the present invention.

A distribution box control panel for use with the fastening device 100 of the invention will be described with reference to FIGS. 4 and 5. As shown in FIG. 4, a fastening device installation portion 210 is formed on a distribution box control panel 200, such as an HMI and NC panel (i.e., a human-machine interaction interface and a numerical control unit), the fastening device installation portion 210 is, for example, a cut-out in a side wall of the distribution box control panel, and the fastening device 100 can be accommodated in the fastening device installation portion 210 in the transverse direction. Tooth-like structures 220 are formed on two sides of the fastening device installation portion 210, and the tooth-like structures 220 are configured such that when the fastening device 100 is placed in the fastening device installation portion 210, the tooth-like structures 143 of the locking member 140 of the fastening device 100 can engage with the tooth-like structures 220 of the fastening device installation portion 210. The fastening device installation portion 210 can be formed arbitrarily in terms of number, at appropriate positions in four side walls of the distribution box control panel 200, to ensure that the distribution box control panel 200 can be securely mounted to the distribution box.

FIG. 5 shows a method of installing the fastening device 100. Firstly, the fastening device 100 is pushed into the fastening device installation portion 210 of the distribution box control panel 200 while the locking member 140 is pressed, such that the push block 110 bears against the distribution box 300.

Then, the fastening device 100 is further pushed towards the distribution box 300 to make the biasing member 120 deformed, preferably to reach a maximum amount of deformation. However, the user can also control the amount of deformation of the biasing member by himself in accordance with the actual situation to control the size of the fastening force. Finally, the locking member 140 is loosened such that the tooth-like structures 143 of the locking member 140 engage with the tooth-like structures 220 on the distribution box control panel 200 and, hence the distribution box control panel 200 is fastened to the distribution box 300. Accordingly, a method for disassembling the fastening device 100 comprises pressing the locking member 140 such that the tooth-like structures 143 of the locking member 140 are retracted and the fastening force of the biasing member 120 is removed, and then pulling the fastening device 100 out of the fastening device installation portion of the distribution box control panel.

The fastening device 100 in accordance with the disclosed embodiments of the present invention is used to fasten the distribution box control box 200 such as an HMI and NC panel to the distribution box 300, where when the fastening device 100 is placed in the fastening device installation portion 210 of the distribution box control panel 200, the push block 110 bears against the distribution box 300, and the tooth-like structures 143 of the locking member 140 engage with the corresponding toothed structures 220 provided on the two sides of the fastening device installation portion 210 of the distribution box control panel 200, so that the biasing member 120 located between the housing 130 and the push block 110 remains deformed, thereby providing a constant fastening force.

It should be noted that although the fastening device of the present invention is described to be used for fastening a distribution box control panel to the distribution box, the fastening device of the present invention is not limited to this application, and instead can be used on any occasion wherein two components or assemblies or devices or apparatuses are required to be fitted and fastened to each other.

In the present invention, the biasing force of the biasing member (for example, the elastic force of a spring) is used to fasten equipment, and the elasticity of the locking member having a bent structure is used to realize assembly and disassembly. Therefore, without any additional tools, the user can complete the installation by hand conveniently and quickly, and the fastening force provided by the fastening device of the embodiments of the invention is constant, such that more stable and reliable fastening can be achieved. In addition, the fastening device of the embodiments of the invention can be used with a variety of iron plates of different thicknesses, with a good compatibility.

The embodiments described above are merely preferred embodiments of the present invention, and are not intended to limit the present invention; any modification, equivalent replacement, or improvement etc. made within the spirit and principles of the present invention should be included within the scope of protection of the present invention.

Figure 6:
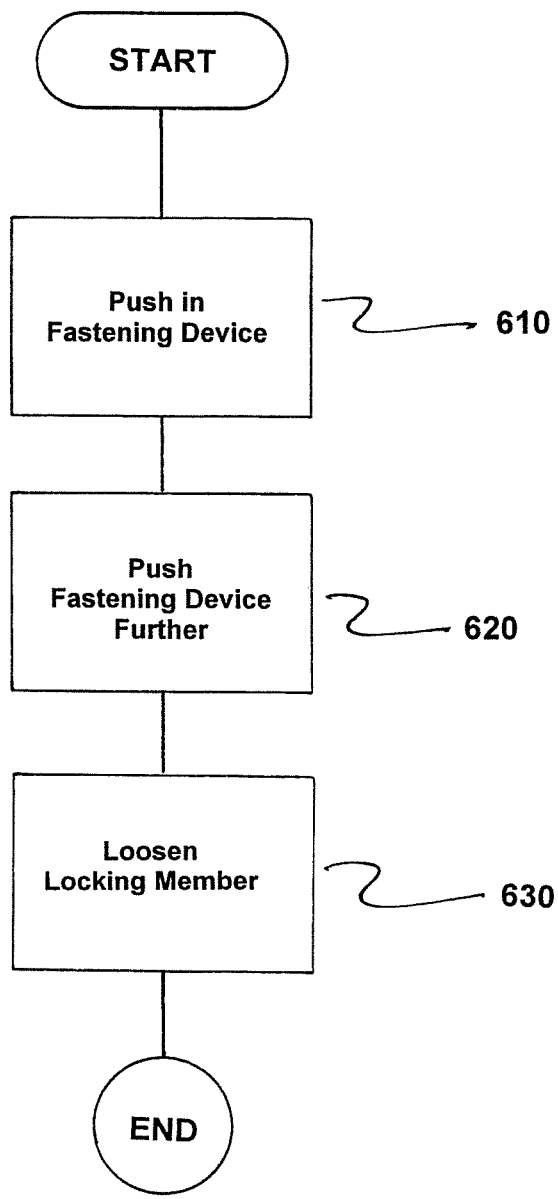
FIG. 6 is a flowchart of the method in accordance with the invention.

FIG. 6 is a flowchart of a method for fastening a distribution box control panel to a distribution box via a fastening device. The method comprises pushing the fastening device into a fastening device installation portion of the distribution box control panel while pressing a locking member, such that a push block bears against the distribution box, as indicated in step 610.

Next, the fastening device is further pushed towards the distribution box to cause a biasing member to deform, as indicated in step 620.

The locking member is now loosened to engage tooth-like structures of the locking member with tooth-like structures on the distribution box control panel, as indicated in step 630.

While there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A fastening device comprising:
   a push block;
   a housing; and
   a biasing member positioned between the push block and the housing in a longitudinal direction, said biasing member being deformable to provide a fastening force;
   a locking member sheathed in the housing and having a bent structure so as to have elasticity in a transverse direction, and having tooth-like structures transversely protruding from two sides of the housing in opposite directions;
   wherein said tooth-like structures are retractable into the housing when the locking member is pressed towards a center in the transverse direction; and
   wherein the fastening device fastens a distribution box control panel to a distribution box, when the fastening device is installed in the distribution box control panel, the push block bears against the distribution box and the tooth-like structures of the locking member engage with corresponding tooth-like structures arranged on two sides of a fastening device installation portion of the distribution box control panel.

2. The fastening device as claimed in claim 1, wherein said distribution box control panel is a human machine interface (HMI) panel or a numerical control unit (NC) panel.

3. The fastening device as claimed in claim 1, wherein said biasing member is a spring, and said fastening force is a restoring force of the spring.

4. The fastening device as claimed in claim 1, wherein spring is a coil spring.

5. The fastening device as claimed in claim 1, wherein the push block is one of removably and permanently connected to the biasing member, the housing is one of removably and permanently connected to the biasing member, and the housing is one of removably and permanently connected to the locking member.

6. The fastening device according to claim 1, wherein the housing has a hollow opening, through which the locking member is sheathed in the housing.

7. The fastening device according to claim 6, wherein the housing comprises a longitudinal beam formed in a center of said hollow opening, a thickness of the longitudinal beam is less than a thickness of the housing, and at least one protrusion is formed on two sides of the longitudinal beam, respectively; and
   wherein said locking member includes a groove formed in a central portion and penetrating through in a longitudinal direction, and at least one notch, a position and number of which correspond to those of said at least one protrusion of the longitudinal beam of the housing, is formed on two side walls of the groove, respectively.

8. The fastening device according to claim 1, wherein the locking member has a cross section substantially shaped like a Chinese character "凹" having an open bottom, has extensions extending transversely and outwardly from two edges at a bottom thereof, and the tooth-like structures of the locking member are provided at outer rims of said extensions.

9. The fastening device according to claim 1, wherein the tooth-like structures of the locking member are composed of continuous or intermittent teeth.

10. The fastening device according to claim 1, wherein said push block, said housing and said locking member are made of plastic.

11. A distribution box control panel having a fastening device installation portion for a fastening device according to claim 1, the fastening device installation portion being configured as a cut-out formed in a side wall of the distribution box control panel, two sides of the fastening device installation portion being formed with a tooth-like structure, and said tooth-like structures being configured to engage with the tooth-like structures of the locking member of the fastening device.

12. A distribution box control panel assembly comprising:
   a fastening device comprising:
      a push block;
      a housing; and
      a biasing member positioned between the push block and the housing in a longitudinal direction, said biasing member being deformable to provide a fastening force;
      a locking member sheathed in the housing and having a bent structure so as to have elasticity in a transverse direction, and having tooth-like structures transversely protruding from two sides of the housing in opposite directions;
   and further comprising:
      a distribution box control panel having a fastening device installation portion for the fastening device, the fastening device installation portion being configured as a cut-out formed in a side wall of the distribution box control panel, two sides of the fastening device installation portion being formed with a tooth-like structure, and said tooth-like structures being configured to engage with the tooth-like structures of the locking member of the fastening device;
wherein said tooth-like structures are retractable into the housing when the locking member is pressed towards a center in the transverse direction.

* * * * *